United States Patent
Elliott et al.

(10) Patent No.: US 6,826,247 B1
(45) Date of Patent: Nov. 30, 2004

(54) DIGITAL PHASE LOCK LOOP

(75) Inventors: William D. Elliott, Sunnyvale, CA (US); Charles F. Neugebauer, Palo Alto, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/534,932

(22) Filed: Mar. 24, 2000

(51) Int. Cl.[7] .................................................. H03D 3/24
(52) U.S. Cl. ...................... 375/376; 327/150; 327/153; 327/159; 348/505; 348/522; 348/537
(58) Field of Search ................................. 375/371, 373, 375/375, 376; 327/144, 147, 150–152, 153, 155, 156, 159, 162, 163; 348/505, 521, 522, 524, 536, 537, 540

(56) References Cited

U.S. PATENT DOCUMENTS

| | | | | |
|---|---|---|---|---|
| 5,218,314 A | * | 6/1993 | Efendovich et al. | ......... 327/152 |
| 5,319,681 A | | 6/1994 | Meyer | |
| 5,448,191 A | | 9/1995 | Meyer | |
| 5,563,531 A | | 10/1996 | Meyer | |
| 5,659,585 A | | 8/1997 | Meyer | |
| 5,841,430 A | | 11/1998 | Kurikko | |
| 5,936,678 A | * | 8/1999 | Hirashima | ................... 348/537 |
| 6,002,279 A | | 12/1999 | Evans et al. | |
| 6,122,336 A | * | 9/2000 | Anderson | .................... 375/371 |
| 6,628,276 B1 | * | 9/2003 | Elliott | ......................... 345/213 |

FOREIGN PATENT DOCUMENTS

| | | |
|---|---|---|
| WO | WO 99/67882 | 12/1999 |
| WO | WO 00/14879 | 3/2000 |

OTHER PUBLICATIONS

Osicom Technologies Inc. Technical Staff, "Direct–Digital Frequency Synthesis . . . a basic tutorial" pp. 1–19.

(List continued on next page.)

*Primary Examiner*—Stephen Chin
*Assistant Examiner*—Dac V. Ha
(74) *Attorney, Agent, or Firm*—Stephen C. Bongini; Lisa K. Jorgenson

(57) ABSTRACT

A system includes a digital phase lock loop (PLL) constructed from an all digital circuit implementation and standard cell construction. The digital PLL includes a digital frequency synthesizer and a digital phase detector. The digital frequency synthesizer includes a digital DLL including a plurality of delay chains, each of the delay chains including at least one digitally programmable delay element for configuring the plurality of delay chains to achieve a phase lock with an input reference signal. The digital frequency synthesizer also a non-glitching MUX electrically coupled to the digital DLL for selecting a tap output from one of the at least one digitally programmable delay element to select at least one pulse glitch-free from the selected output tap, and a phase accumulator electrically coupled to the non-glitching MUX for precisely dividing a timing period of the input reference signal and for selecting a tap output from one of the at least one digitally programmable delay element to select at least one pulse at a precise point in the timing period from the output tap. The digital phase detector, is electrically coupled to the digital frequency synthesizer to compare an edge of the input reference signal to an edge of a synthesized signal to provide a digital code information representing a phase error between the edge of the input reference signal and the edge of the synthesized signal.

27 Claims, 8 Drawing Sheets

OTHER PUBLICATIONS

Mark G. Johnson et al., "A Variable Delay Line PLL for CPU–Coprocessor Synchronization", Reprinted from IEEE Journal of Solid–State Circuits, vol. SC–23, Oct. 1988, pp. 333–338.

Jeff Sonntag et al., 1990 IEEE International Solid–State Circuits Conference Digest of Technical Papers, First Edition Feb. 1990,. Session 11: High–Speed Communication IC's, FAM 11.5: "A Monolithic SMOS 10MHz DPLL for Burst–Mode Data Retiming", pp 194–195.

Ian A. Young et al., "A PLL Clock Generator with 5 to 110 MHz of Lock Range for Microprocessors", Reprinted from IEEE Journal of Solid–State Circuits, vol. SC–27, Nov. 1992, pp. 339–346.

I.N. Gurevich et al., Radio–Electronic Circuts and Devices, "Controllable Delay Devices in Two–Level Frequency–Synthesis Systems", Telecommunications and Radio Engineering 48(5). 1993, pp. 61–68.

Dina L. McKinney et al., "Digital's DECchip 21066: The First Cost–focused Alpha AXP Chip", vol. 6 No. 1, Winter 1994, Digital Technical Journal, pp. 66–77.

Jim Dunning et al., "An All–Digital Phase–Locked Loop with 50–Cycle Lock Time Suitable for High–Performance Microprocessors", IEEE Journal of Solid–State Circuits, vol. 30, No. 4, Apr. 1995, pp. 412–422.

Yoshinori Okajima et al., "Digital Delay Locked Loop and Design Technique for High–Speed Synchronous Interface", IEICE Trans. Electron. vol. E79–C, No. 6 Jun. 1996, pp. 798–807.

Stefanos Sidiropoulos et al., "A Semidigital Dual Delay–Locked Loop", IEEE Journal of Solid–State Circuits, vol. 32, No. 11, Nov. 1997, pp. 1683–1692.

European Search Report dated Jun. 10, 2003 for European Patent Application No. 01302073.

\* cited by examiner

DIGITAL PHASE LOCK LOOP

BACKGROUND OF THE INVENTION

1. Field of the Invention

This invention relates in general to systems that utilize phase lock loops, and more particularly to a system that utilizes a digital phase lock loop.

2. Description of Related Art

A variety of electronic devices, such as computers, monitors, flat panel displays, wireless communication devices, cellular phones, high speed two-way digital transceivers, and paging devices, to name just a few, utilize a plurality of synchronous signals, e.g., clock signals, vertical-synch and horizontal-synch signals, spread spectrum and digital wireless communication signals, etc., that are phase synchronized with other signals associated with such devices. A key part of the synchronization function is usually handled by a phase-locked loop circuit. A phase comparator or phase detector constitutes a main functional component in the signal phase synchronization process.

Phase lock loop circuits have been conventionally manufactured using analog circuit construction. An analog phase detector in a phase lock loop produces an analog output signal, for example a voltage signal, to indicate a phase difference. In a phase-locked loop, for example, this analog signal may control a frequency source, such as a voltage controlled oscillator (VCO). High precision adjustments in the frequency signal output from the VCO may depend on very precise, custom analog circuit design and components for an analog phase detector.

Analog phase lock loops, as with most analog circuit designs, suffer from sensitivity to noise signals, temperature variability, and manufacturing process variations. Further, to increase the precision of an analog circuit may require significant additional component cost and multiple fabrication iterations. Furthermore, analog circuit designs tend to require large circuit real estate such as to implement a precision phase lock loop circuit. Additionally, as with any analog circuit design, the design time tends to be long in order to port a design to a new circuit manufacturing process. To transfer an analog phase lock loop to a new manufacturing process, the design effort and risk are substantially the same as the original design.

With the increasing popularity of digital circuits in all of the aforementioned devices, the trends are 1) toward smaller and more compact devices requiring smaller real estate circuit designs, 2) continuous improvements in circuit manufacturing technologies requiring easily adaptable circuit designs for new technologies, and 3) increasing demand for higher precision signal phase synchronization. It is unfortunate, therefore, that there is not available a high precision all digital phase lock loop circuit for such electronic devices and that overcomes the disadvantages of the prior art as discussed above.

Thus, there is a need to overcome the disadvantages of the prior art as discussed above.

DETAILED DESCRIPTION OF THE PREFERRED EMBODIMENTS

Figure 1:
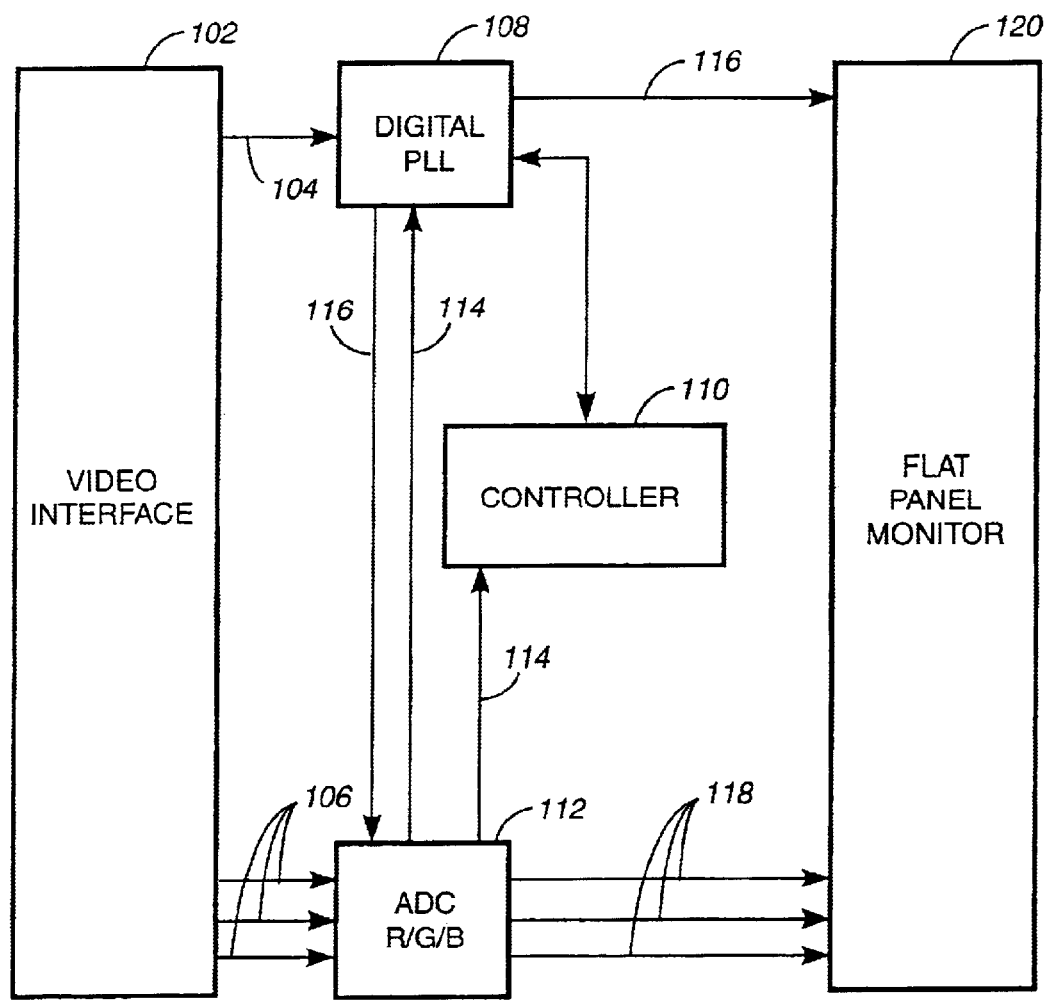
FIG. 1 is a block diagram illustrating an exemplary electronic device, such as a flat panel monitor display device, in accordance with a preferred embodiment of the present invention.

A graphics card inside a PC typically contains a graphics accelerator IC and a frame buffer. The graphics accelerator renders a frame of data in memory then converts to analog and transmits to the LCD monitor via the analog VGA cable. In addition to the analog data, horizontal and vertical synchronization signals are transmitted. The clock data used to generate the analog output stream is not transmitted increasing the difficulty of accurate reproduction at the LCD monitor. Flat panel monitors based on liquid crystal display (LCD) technology are rapidly deploying into the personal computer display marketplace. Flat panel monitors offer performance advantages over conventional CRT monitors, but the PC industry faces challenges in seamlessly integrating them into the desktop PC environment. In addition to size, weight and power advantages flat panel monitors improve image acuity. Flat panel monitors are digital devices, and have the benefits of digital technology in the panel electronics, compared to analog CRT technology. Each pixel element in a flat panel monitor is micro-lithographically defined, which results in precisely defined pixel areas, unlike the fuzzy overlap of phosphor dots and the electron beam in a CRT.

Most LCD modules used in flat panel monitor applications require digital interfaces. These digital interfaces create difficulties in connecting to the analog graphics output of today's personal computer. Expensive and complex analog circuit boards have been used to convert the analog signals from the PC into the digital signals required by flat panel. In the past, users have been unable to realize all of the image quality benefits of flat panel monitors because these boards have not been able to perfectly reproduce the digital source data, as it existed in the PC.

These interface challenges and user expectations set the flat panel monitor electronics requirement. Compatibility with the PC environment starts with properly reconstructing the clock and converting the analog data from the PC into a digital format.

The synchronization signals are used by the reconstruction processor to regenerate the pixel clock. The new pixel clock is used by the analog to digital converters to capture the input data in digital form. The digital signal reconstruction process consists of three steps. Sync and video timing information is first used to determine the video mode of the graphics card driving the analog cable. The mode detection circuit then programs the clock recovery circuit, the phase lock loop (PLL), to regenerate the pixel clock. Finally the pixel clock is provided to the analog to digital converters which transforms the input analog red, green, and blue (RGB) signals to digital format. In the first step inside the LCD monitor, the analog subsystem attempts to detect the video mode of the graphics IC. Based on the detected mode, the phase lock loop is programmed to generate a certain number of pixel clocks per horizontal sync. The analog to digital converters then produce digital outputs, using this reconstructed clock.

The present invention provides modern electronic devices with high precision all digital phase lock loop and high precision digital phase comparator circuits that overcome the disadvantages of the prior art. A digital phase measurement system, according to a preferred embodiment of the present invention, measures the phase difference between two digital signals with high precision, such as to a fraction of a nanosecond. The system uses an all digital phase comparator circuit that is synthesizable through normal digital application specific integrated circuit (ASIC) design flow.

According to a preferred embodiment of the present invention, the digital phase comparator circuit uses a novel configuration of a plurality of delay element chains coupled with a symmetric set of combination logic gates, as will be discussed in detail below. This novel circuit implementation accurately measures the difference in arrival times between the edges of two digital signals, such as to within a fraction of a nanosecond. The measurement is encoded into a digital time delay bit pattern that can be used, for example, by a controller to adjust a digital signal frequency generating circuit. This novel circuit implementation preferably is incorporated into an integrated circuit device using standard cells. The implementation can effectively avoid custom design and components. A particular advantage of the present invention is that the delay element chains are preferably built with very fine granularity. In other words, very short time delays for each delay element enables a very fine resolution of time even with discrete delay elements. So there is less of a requirement for an analog design to obtain fine resolutions in time. Furthermore, a digital measurement can be refined for high effective precision by further numerical filtering such as averaging.

Referring to FIG. 1, according to a preferred embodiment of the present invention, a new and novel flat panel monitor system 100 comprises a digital phase lock loop 108 that includes a digital phase detector. The new flat panel monitor system 100, for example, utilizes a digital phase lock loop 108 to synchronize analog signals 104, 106, received from a graphics controller (via a video interface 102) and couples high precision digital representations of these analog signals to operational circuits in the flat panel monitor 120. The analog signals consist of red, green, and blue, information 106 to drive pixels in a monitor display 120. For example, three different voltage levels on three different wires provide the red, green, and blue, information 106 that is coupled to the monitor display 120 via an analog to digital converter (ADC) module 112. A controller 110 is electrically coupled to the digital PLL 108 and to the ADC module 112 to monitor the digital operation and modes of the system 100 and to control the operation of the Digital PLL 108 in accordance with the operational mode of the system 100.

A vertical synchronization signal (V-sync) and a horizontal synchronization signal (H-sync), typically on two additional separate wires, provide general display synchronization for rasterizing an image on the screen of the monitor display. An H-sync signal 104 is electrically coupled to the Digital PLL 108. However, no pixel clock is available on the signal cable to drive the monitor display 120 to synchronously rasterize an image across the pixels of the display screen. The flat panel monitor system 100 utilizes a graphics display engine to generate a digital pixel clock signal based in part on a reference H-sync signal. Based on the operational mode of the system 100, for example, the graphics display engine generates a thousand pixel clocks in between H-sync signals to synchronously drive the pixels of the flat panel display monitor 120. That is, the system 100 divides the H-sync time period by a thousand with a very fine phase resolution to drive pixels, such as LCD pixel elements, in a flat panel monitor display 120. Therefore, the synthesized pixel clock signal comprises a very accurate frequency and phase resolution typically to a fraction of a nanosecond. The system 100, in this example, requires a very precise phase lock loop 108 to divide a thousand, or two thousand or higher, divide ratio between H-sync period and the synthesized clock period depending on the preselected video mode for the flat panel monitor 120.

It is very challenging and expensive to provide a precise phase phase locked frequency source by analog circuit design that is also relatively insensitive to various things like noise, temperature, and manufacturing process variation. A significant advantage of the present invention is that it provides an all digital solution where it avoids much of the sensitivities to noise, temperature, and manufacturing process variation. The precise calculations, according to the preferred embodiment of the present invention, are done all in a digital domain rather than utilizing precise analog components. Another significant advantage of the present invention is that once it is an all digital domain solution, the precision and stability of the signal synthesis can be increased to a very high and arbitrary amount.

Figure 2:
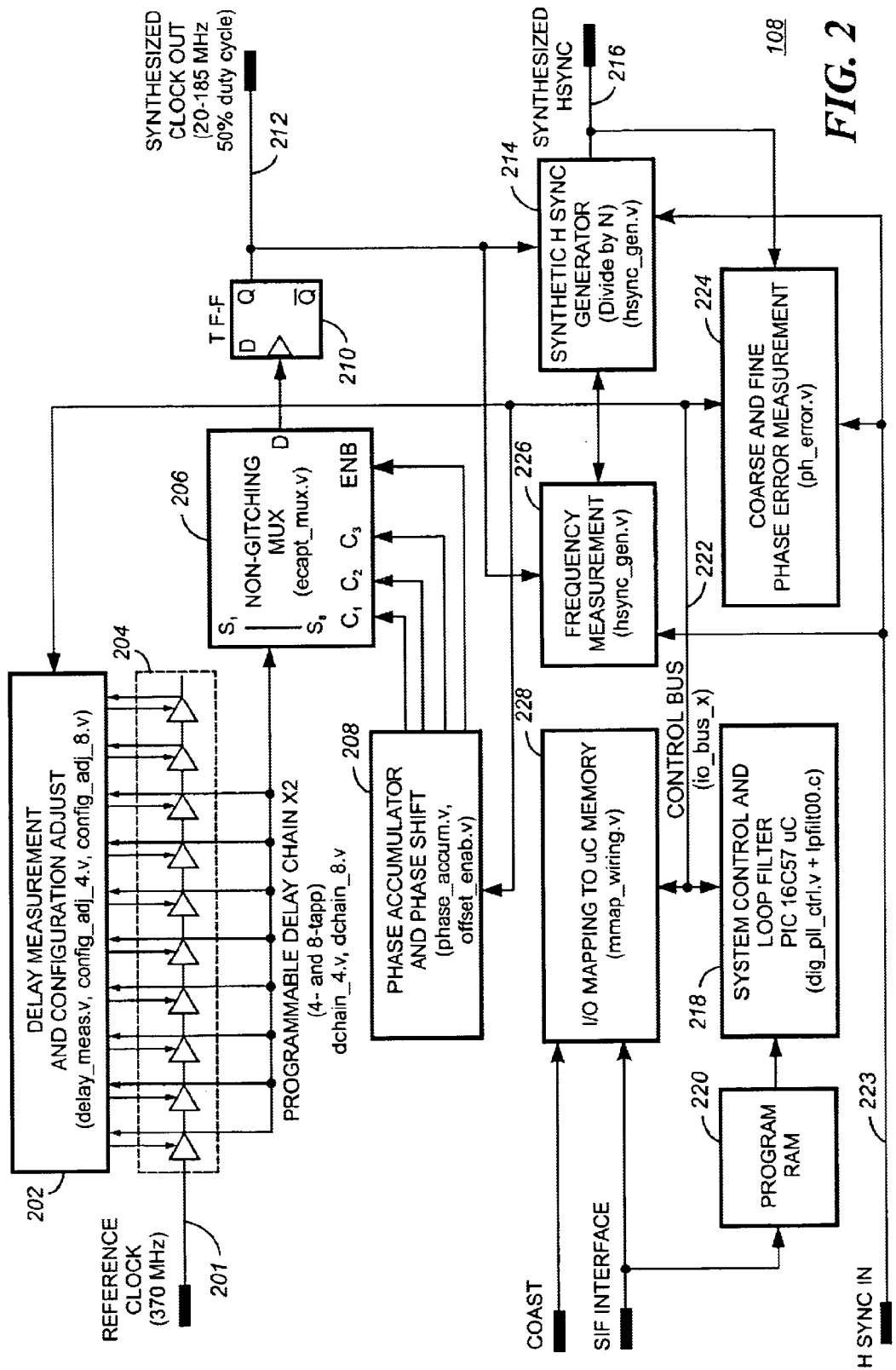
FIG. 2 is a circuit block diagram of the exemplary electronic device of FIG. 1 comprising a digital phase lock loop (PLL) implementation utilizing a high precision digital phase comparator, in accordance with a preferred embodiment of the present invention.

Referring to FIG. 2, the digital phase lock loop (DPLL) 108, according to the present example, comprises a digital frequency synthesizer generator that generates a synthesized H-sync signal at an output 216. The DPLL 108 also comprises a digital phase detector 224 that measures the phase of the H-sync signal relative to a reference H-sync signal at an input 223. A digital controller and digital loop filter 218 control the overall process of generating a highly precise frequency synthesis. The digital phase detector 224 generates a phase error signal and couples the phase error signal to the system controller 218 via the control bus 222. The controller 218 operates a digital loop filter, such as a low pass filter to integrate undesirable changes in signal frequency and phase, and the controller 218 then provides a feedback signal to the frequency synthesizing module 202. The whole system operates, according to the preferred embodiment of the present invention, as a feed back control system.

In order for the system 100 to operate in a digital mode, such as for increased accuracy, portability of design, insensitivity to varying temperature, noise, and manufacturing process, the phase detector 224 preferably produces a digital output. This phase detector 224 therefore is in a category of phase detectors that yield very precise time-to-digital conversions. The additional feature of the phase detector 224, in accordance with a preferred embodiment of the present invention, is that the phase detector 224 is made from all digital components or synthesizable components.

The digital phase lock loop 108 comprises a frequency synthesizer, a phase detector 224, and a loop filter 218. In this example, the frequency synthesizer comprises the delay measurement and configuration adjust block (Digital DLL) 202, the phase accumulator 208, and the Non-glitching Mux 206, and also the toggle flip-flop 210 and a reference clock generator which is not shown. The combination of these digital components creates a digital frequency synthesizer. If a thirty two bit number is provided to the phase accumulator 208, a high precision frequency signal is generated at the synthesized clock output 212. This frequency synthesizer sub-system takes a 32 bit fixed precision number and generates a 50% duty cycle clock at a precise frequency up to ½ the reference clock. Alternatively, the sub-system generates a low-duty cycle pulse train at a precise frequency up to the reference clock frequency.

The Digital DLL 202 creates phase delayed versions of a reference clock, dividing the reference clock period evenly, such as into 8 phases. This Digital DLL 202 consists of multiple (in this example two) delay chains created from digitally programmable delay elements, and a control system that configures the chains to achieve phase lock and selects one delay chain to be active. This sub-system will be discussed in more detail below.

A Phase Accumulator 208 divides the reference clock period by a precise number and selects a tap of the Digital DLL 202 to get a pulse at the correct moment in time. This pulse goes through a toggle flip flop 210 if a 50% duty cycle clock is necessary. The Phase Accumulator 208 is preferably a pipelined architecture counter. The phase accumulator 208 interoperates with the Non-Glitching MUX 206 to select pulses glitch-free all the way up to the reference clock frequency. This is a significant advantage of the present invention that is not available in prior art systems. This sub-system will be discussed in more detail below. This edge selecting frequency synthesis circuit is much better than typical digital frequency synthesis circuits which in the past have used digital-to-analog converters, filters, and comparators to convert the sampled reference clock into an output clock. It has the advantages of being portable, uses much less chip area, and high output frequency range of up to ½ the reference clock at 50% duty cycle. The downside of this frequency synthesis circuit is its inherent jitter due to delay granularity and sensitivity to synchronous noise.

This phase comparator sub-system 224 compares the reference H Sync signal edge to a synthesized H Sync (generated by dividing down the output clock frequency with a counter) and outputs a digital number that represents phase error in time. The sub-system provides both a wide adjustment range and a high precision (fraction of ns) when in near-lock condition. To accomplish this, it is broken down into a coarse and fine phase measurement. The coarse phase measurement comprises a counter that counts clock periods between the two H Sync pulse arrivals, in this example. The fine phase measurement, according to the present example, sends the two H Sync pulses down two long delay chains and determines the phase difference in units of delay taps. This novel Fine Phase Measurement sub-system provides significant advantages that have not been available before. It will be discussed in more detail below.

The phase detector 224 measures the phase difference between the two H-sync signals, i.e., the reference H-sync signal and the synthesized H-sync signal. Note that in this application the synthesized H-sync signal is the synthesized clock output frequency divided by N, where N is the number of clock signals in between every H-sync signal. Recall that, in this application, the synthesized clock signals drive the timing for pixel elements of an LCD display for the flat panel monitor 120. Then, the loop filter that is part of the code inside the micro-controller 218 does a digital loop filter function, which is programmable to an arbitrary filter function. In this example, the filter is a first order low pass filter to filter the phase error signal and to create a new phase accumulator value and then update the phase accumulator 208 via the bus 222. Additionally, a frequency measurement block 226 provides a means of affirmatively checking an actual frequency of a synthesized clock signal at output 212. This is useful because measurement of phase alone can be ambiguous while frequency is a definite measurement.

The digital loop filter is preferably implemented in software in an embedded microcontroller (uC) 218 that also controls the whole system. A software digital loop filter has the advantage of programmability, and noise and temperature drift immunity, as compared to an RC loop filter made of resistors and capacitors either internal or external to an ASIC. The uC can be low performance computation-wise because of the usually thousands of processor clocks available between H Sync phase measurements. This sub-system will be discussed in more detail below.

There are other support circuit blocks, such as I/O mapping 228 and program and data memory 220. The memory 220 can be a volatile memory such as illustrated in the FIG. 2. Alternatively, the memory 220 can be a non-volatile memory that can contain program and parameters for the controller 218. The loop filtering performed by the controller 218, for example, can be adjusted by reconfigurable parameters and program code in the memory 220.

The synthesized H-sync signal at the output 216 provides a phase aligned synchronous version of the reference H-sync signal at the input 223. The synthesized H-sync signal can be used as a synchronous version of the input reference H-sync signal. The analog to digital converter module 112 digitizes the red, green, and blue voltage levels at the input 106. The display in the flat panel monitor 120 is digital and it uses the synthesized clock out from this DPLL 108, such as at output 116, as the display's clock source. Additionally, the synthesized H-sync signal and a synthesized V-sync signal are used to synchronously drive the rasterizing of the pixels of the display with the RGB digital clocked signals and drive the refresh of each horizontal line and the vertical refresh of all the lines in the display screen. The analog video data from the video interface 102, therefore, is all converted into digital form and then synchronously delivered to digital logic circuits downstream of the analog-to-digital converter 112 to drive the flat panel monitor display 120 with synchronous digital signals that very precisely represent the analog video data. The all digital solution, as discussed above, is a significant advantage of the present invention that is not available in prior art system.

Figure 3:
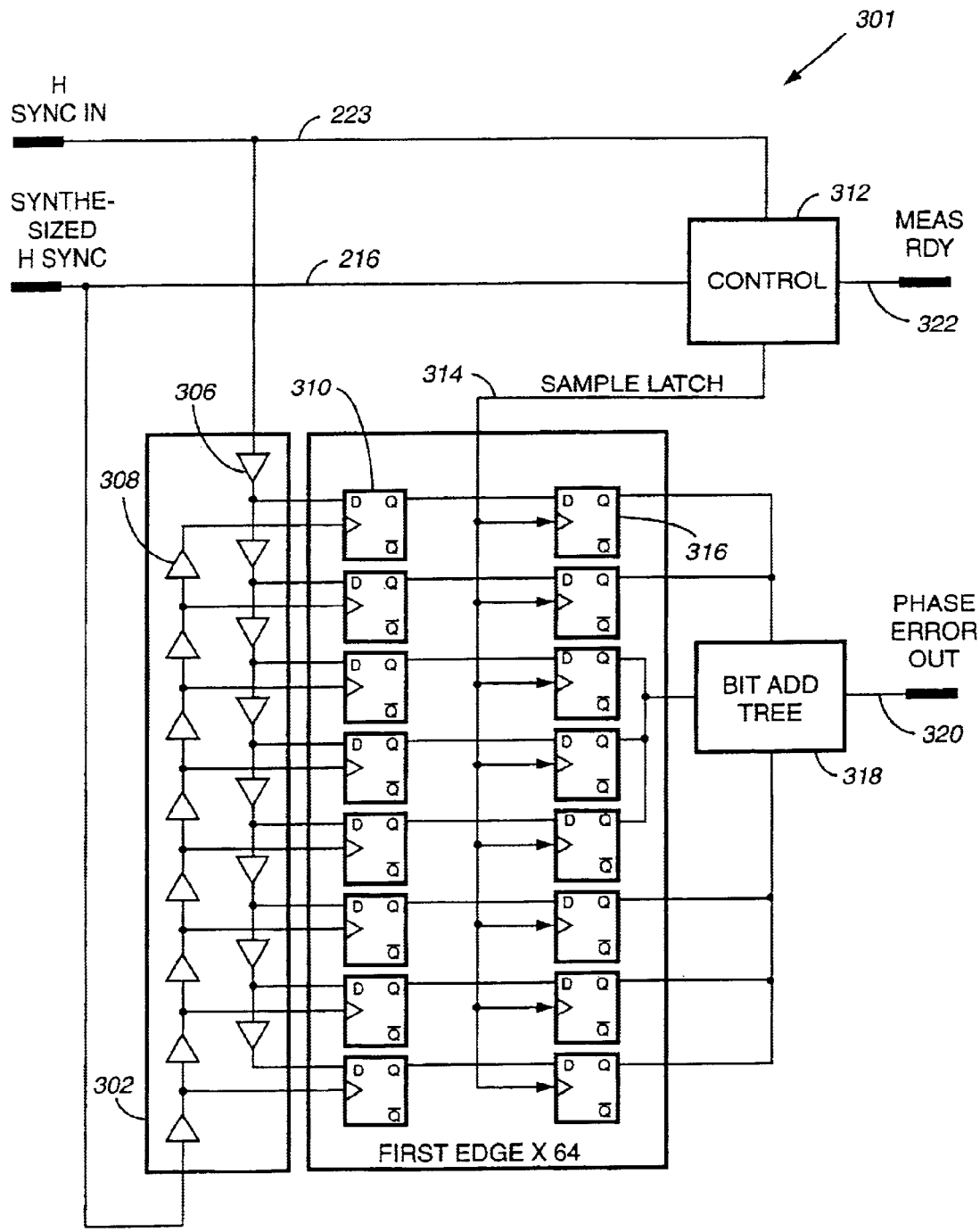
FIGS. 3 and 4 are more detailed circuit block diagrams of the phase comparator shown in FIG. 2, according to a preferred embodiment of the present invention.
Figure 4:
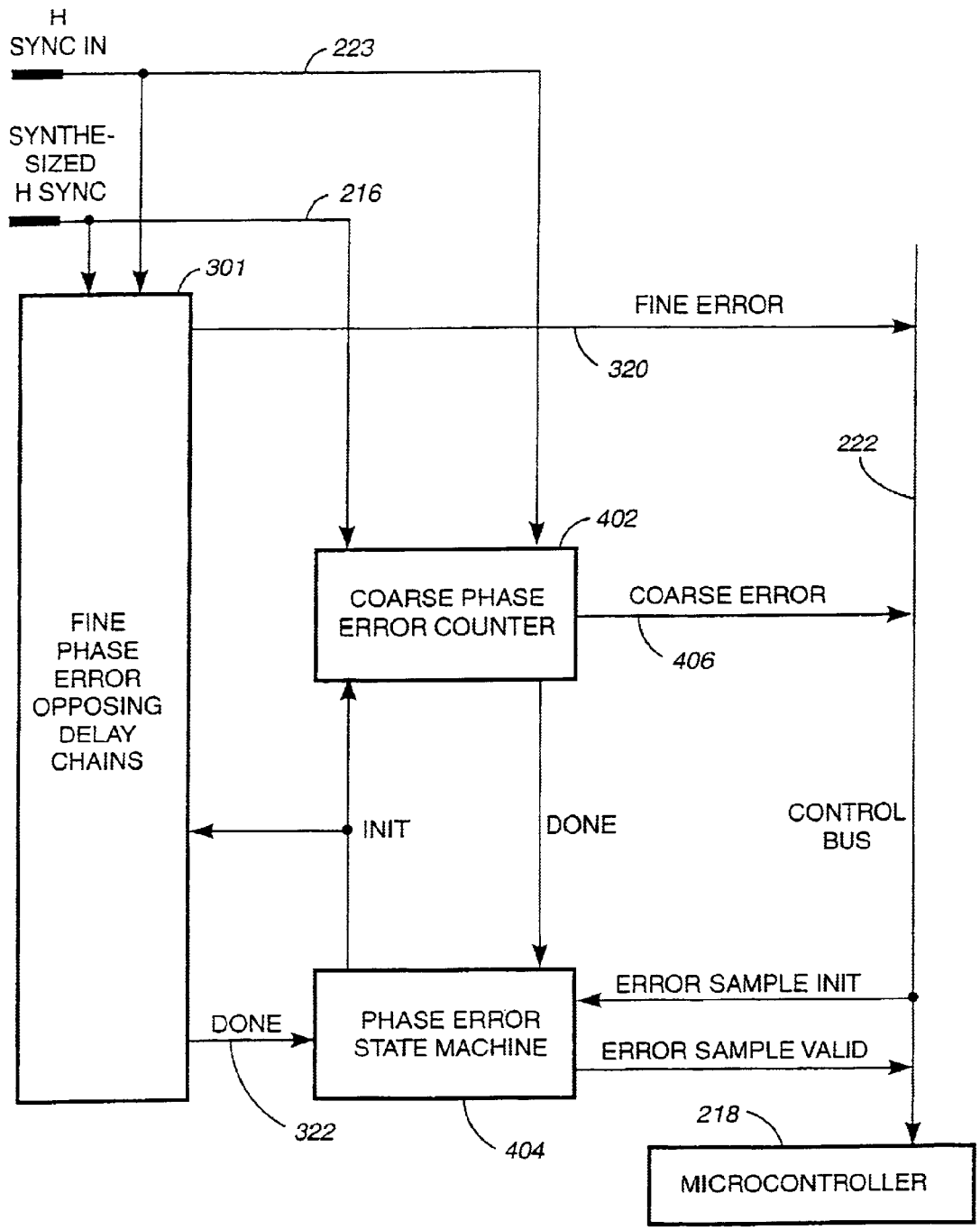

Referring to FIGS. 3 and 4, a more detailed view of the coarse and fine phase error measurements module 224 is shown, in accordance with a preferred embodiment of the present invention. The course and fine phase error measurement module 224 is of the type of phase detector referred to as a time to digital converter. The fine phase measurement circuits, shown in FIG. 3, and the coarse phase measurement circuits, shown in FIG. 4, are each a time-to-digital converter. A time measurement is converted to a digital code.

The coarse phase error measurement is accomplished by triggering a counter 402 with the two relative signals for comparison. The counter 402 triggers with the first arriving H-sync signal, either the synthesized or the reference H-sync signal, and starts counting. The counter 402 counts time increments until the next H-sync signal arrives and triggers a stop count. This provides a very coarse granularity of the clock in use which, for example, can be 100 MHz in a system 100. The coarse phase measurement provides a very large range of time to compare the phase of the two relative signals. However, when the system 100 approaches lock in between the phase of the two relative signals then the phase comparator 224 switches to measure very fine differences between the phases of the two relative signals, such as to a fraction of a nanosecond. A state machine 404, according to the preferred embodiment, controls the phase comparator 224 to arrive at the phase error measurement.

The system 100 then utilizes the high precision fine phase error measurement circuits, as shown in FIG. 3, to measure very small differences in phase between the two relative signals. The fine phase error measurement circuit 301 comprises an all digital circuit implementation. It consequently benefits from all of the advantages of an all digital design as discussed above. Note that at these small differences in time a counter circuit is not normally practical and consequently the fine phase error measurement utilizes a novel circuit arrangement to calculate sub-nanosecond differences in time between two signals.

Two delay chains 302 are arranged in opposing timing orientation and are driven by the two respective relative signals, e.g., the first delay chain is driven by the reference H-sync signal and the second delay chain is driven by the synthesized H-sync signal. The output of the first delay element 306 in the first delay chain drives a first input of a D-flip flop 310, while the output of the last delay element 308 of the second delay chain drives a second input, such as the clock input, of the D-flip flop 310. The arrangement of delay elements in the two delay chains 302, as illustrated in FIG. 3, and driving the inputs of D-flip flops, provides a comparison of the two relative signals.

Specifically, each of the two delay chains 302 carries one of the signals whose phases will be compared, running in "opposite directions". Each pair of taps (one tap from each delay chain) is connected to a set of combinational logic that acts as a symmetric flip-flop 310. In other words one signal goes to the "D" port and one signal goes to the "Clock". At the end of a signal edge arrival event (controlled by the Control block 312), the output bit of each flip-flop 310 has a one-bit result representing which signal arrived first. The symmetric aspect of the flip-flop 310 is that each signal experiences identical (as much as possible without custom layout) loads and delays so it is a "fair race". With 64 such tap pairs and flip flops 310, in this example, the 64 total output bits represent a thermometer-type measurement of the relative time or phase delay between the two signal edges. A zero delay value, or zero time difference between the two signals, will result in half the thermometer bits ON, and half the bits OFF. The precision of the time delay measurement is dependent on the delay time of each delay chain element, which for example is approximately 0.2 ns.

There are several ways to encode a thermometer result. The simplest is to find the point of transition along the thermometer from one state to the other. However, in this case, a sum of bits approach provides robustness, such as in case the thermometer is not monotonic.

Although eight delay elements are shown, the preferred number of delay elements is much greater, such as 64, 128, or greater. The larger number of delay elements provides a larger "landing zone" for the edges of the two signals to be compared. The sample latches 316 capture the outputs of the flip-flops 310. The controller 312 controls the sample latch event via a latch control line 314. A bit add tree 318 converts the thermometer type measurement, i.e., out of the latches 316, in this example, to a 5 bit or 6 bit code. So, for example, with 64 taps on the delay chain at the output of the symmetric flip-flops 310 there are 64 bits. Some of the bits will be ON and some of them will be OFF. The outputs of the flip-flops 310, followed from top to bottom in FIG. 3, appear like a thermometer. The number that goes to the bit add tree 318 adds up the number of outputs that are set to one. This sum provides a score that indicates which edge of the two relative signals arrived first. So, for example, if the two signal edges arrived at the same time the outputs should be equal numbers of 0's and of 1's, and the score will total to the number 32 (half of the 64 total possible outputs). This number is encoded in the 6 bits. A score of 32 therefore indicates zero difference.

A typical analog phase detector may use differential delay elements to reject power supply noise and other sources of delay variation such as due to temperature and manufacturing process. Digital delay elements normally have no such feature. However, the counter-propagating design described here (two delay chains running in opposite directions) recovers some of the ability of a differential signal to reject noise sources. In this case, each differential delay chain is affected roughly equally by noise such as power supply variations. However, the variation on the output phase error value approaches zero as the signals approaches the zero phase offset point.

After the fine phase error score has been computed, it is made available at output 320 and the output signal measure ready output indicates that the data is ready to be read by the controller 218. The micro-controller 218, in this example, sends a one bit signal (not shown) to enable the fine phase error measurement at circuit block 224. After a measurement is taken, as discussed above, the measurement ready signal 322 indicates that there's a valid phase error value 320 on the bus 222. The controller 218 then reads the value 320 from the bus 222.

Figure 5:
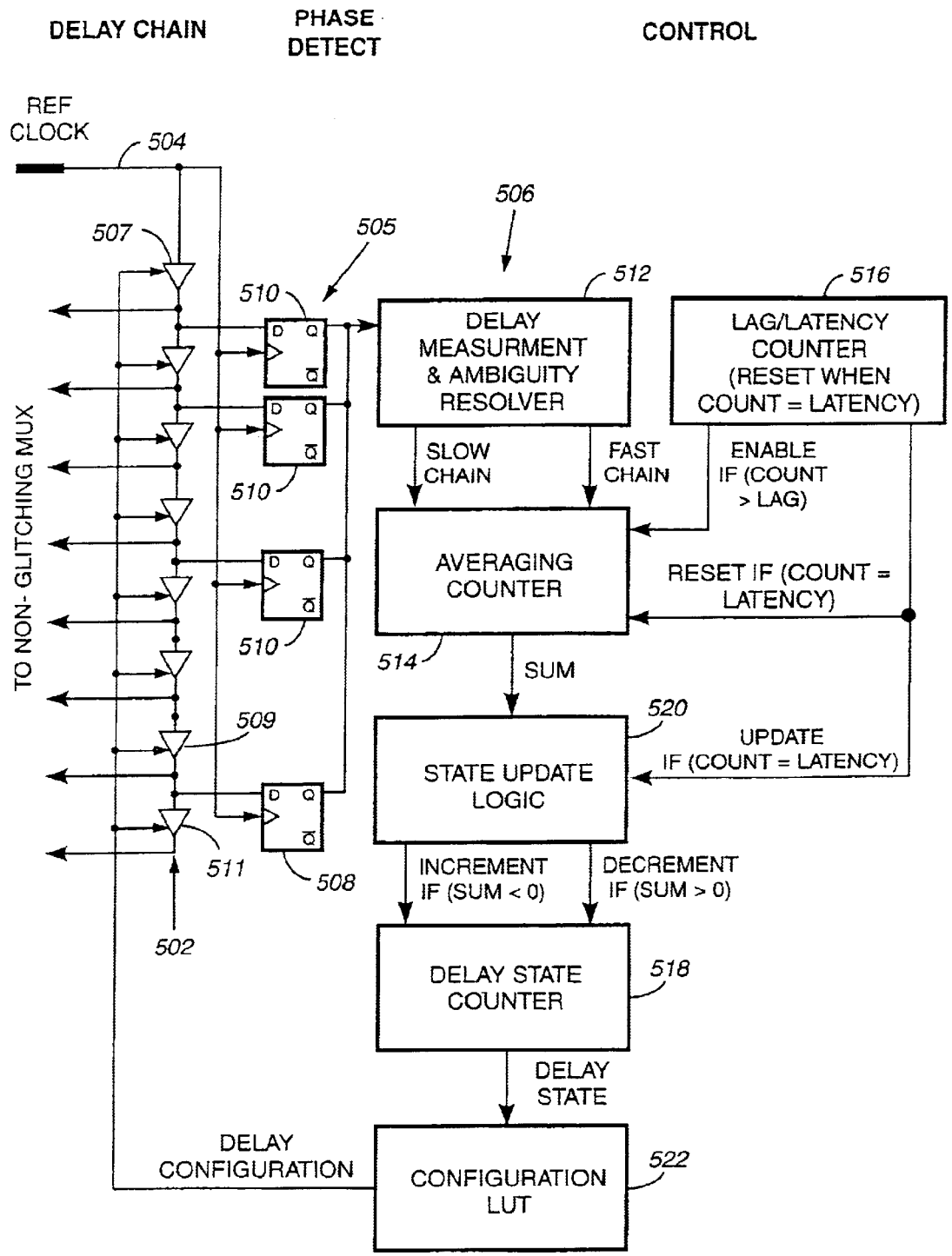
FIG. 5 is a more detailed circuit block diagram of the digital DLL and controller shown in FIG. 2, in accordance with a preferred embodiment of the present invention.

Referring to FIG. 5, a digital delay locked loop (DLL) system is illustrated in accordance with a preferred embodiment of the present invention. The digital DLL is a system constructed of standard logic cells that includes at least one configurable delay chain 502 and a phase measurement and control sub-system. The digital DLL system phase locks to a reference clock 504 and divides the reference clock period into a number of phases equal to the delay elements in the delay chain 502. The clock phases are available downstream for consumption by another system such as a frequency synthesizer. Since the digital DLL system consists of synthesizable standard logic gates rather than custom mixed-signal layout, the design and port time is significantly reduced.

Three sub-system components of the digital DLL system are the delay chain 502, the phase detectors 505 and the control sub-system 506, as will be discussed in detail below. The Delay chain 502 is made of discretely programmable delay elements. Depending on the range of the reference clock period used and the speed of the logic cells, various configurations of delay elements are desired, preferably with 2 to 4 delay settings. Each delay setting sends the input reference clock signal through a different path through a delay element 507. Configuring all the elements in the delay chain 502 controls the total delay through the delay chain 502, and, when combined with the results of the phase detectors 505, allow the digital DLL system to lock in phase with the reference clock 504.

The phase detectors 505 compare the phase at various tap points on the delay chain 502 to the phase of the reference clock 504. The main phase detector 508 compares the signal coming out of the end of the delay chain 502 with the reference clock 504 and activates a bit indicating whether the rising edge of the reference clock 504 arrived before the delay chain signal at the output of the main delay element 509 (delay chain 502 is too slow) or after the delay chain signal at the output of the main delay element 509 (delay chain 502 is too fast). Several other phase detectors 510 are available which check for phase ambiguities. Note that in this exemplary configuration an additional delay element 511 is added to the delay chain 502 to equalize loading on all delay elements in the delay chain 502. Preferably, each of the phase detectors 505 is similar to the symmetric flip flops used in the H sync phase detector of the larger digital phase locked loop system comprising the digital delay locked loop system.

The control system 506 takes the results of the phase detectors 505 and determines a chain configuration update, if necessary. The control system 506 continuously monitors the outputs of the phase detectors 505 for a result and updates the individual elements of the delay chain 502 to set discrete delays settings for each of the delay elements of the delay chain 502. This continuous adjustment of the delay chain elements maintains the delay chain 502 in phase lock with the reference clock 504. The control system 506 determines when a delay chain 502 is phase locked by detecting hunting between too fast and too slow chain configurations. Slow changes in delay values (due to temperature changes) will be followed by the digital DLL system with negligible additional jitter and without a need to reset the system. However, as with any phase lock type of system, separate out-of-lock detectors are inserted for the difficult-to-predict conditions that may cause phase ambiguities. Note that when this occurs, the digital DLL system will be severely out-of-sync, and jitter will be excessive until period lock occurs again. A preferred defense against this condition (i.e., making sure it never occurs) is to provide a quiet power supply for the delay chain 502.

The control system 506, according to a preferred embodiment of the present invention, includes a number of subsystems as will be discussed below. A Delay Measurement And Ambiguity Resolver (DM&AR) 512 receives results from the delay chain phase detectors 505 and generates an increment or decrement signal to the Averaging Counter 514 based on whether the measured delay of the delay chain 502 is too fast or too slow. The DM&AR 512 also controls a reset initialization sequence to steer the system out of ambiguous phase conditions by sampling phase detectors 510 other than the end-of-chain detector 508. According to the preferred embodiment of the present invention, at each reference clock rising edge, each of the D-flip flops 505 compares the arrival time of the reference clock rising edge to the arrival of a time-delayed version of reference clock coming out of one of the taps of the delay chain 502. The one-bit result of this comparison indicates which edge arrived first, the reference clock or the time-delayed reference clock. In a normal steady-state mode of operation when the digital delay locked loop is locked, the delay through the full delay chain equals approximately one reference clock period. In that condition, the D-flip flop 508 attached to the end of the chain 502 is comparing the arrival time of a reference clock edge and the previous reference clock edge delayed by a clock period through the delay chain 502.

During initialization, the intermediate tap points are all used to resolve phase ambiguity. Initialization is the process of starting from an arbitrary chain configuration and arriving at the locked configuration for steady state operation. Extreme variations of voltage, temperature and manufacturing process can result in extreme variations of delay through the delay chain for a given chain configuration that would give ambiguous phase comparison results if only the end-of-chain tap were used. It is possible for the delay through the chain 502 to be more than 2 reference clock cycles, for example. In that ambiguous case, the system could lock on the wrong edge and the system would never reach the proper configuration. Additional tap points enable the DM&AR block 512 to verify that the delay through the chain 502 is exactly one reference clock cycle, or nearly so. During steady-state, the D-flip flop 510 attached to the mid-chain tap point is not used. The D-flip flops 505 attached to the first and second tap points may be used to detect a phase ambiguity in the case of a sudden change in voltage that could cause a change in the delay times through the delay elements and cause an ambiguous phase condition.

The averaging counter 514 counts up or down based on current phase measurement. The averaging counter 514 acts as a measurement averaging filter that is enabled and reset by a Lag/Latency Counter 516. The Lag/Latency Counter 516 first forces a pause in measurement to ensure latest update has propagated through the system (lag), then it controls the duration of the measurement time (latency). After the delay chain 502 is configured according to an update, the Lag/Latency Counter 516 allows the update to propagate to prevent system instabilities by disabling sampling until the change takes effect. The latency (sample time) trades off noise averaging for system response time.

The Lag/Latency Counter 516 continuously cycles, with each cycle representing an update of the delay chain configuration. At the beginning of a cycle, immediately after a delay chain configuration update, the counter begins counting. When the counter 516 reaches the "lag" setpoint, it enables the Averaging Counter 514, which counts up or down based on the DM&AR block 512 output. The Averaging Counter 514 counts up if the chain is too slow, and down if the chain is two fast. Prior to that, from the beginning of the cycle until the "lag" point, phase measurements are ignored by the Averaging Counter 514 to allow the delay chain configuration update to propagate through the system. After the "lag" point, the Averaging Counter 514 continues to sum up the DM&AR 512 output phase measurements until the Lag/Latency Counter 516 reaches the "latency" set point, at that point the State Update Logic block 520 looks at the output sum of the Averaging Counter 514 and sends an update pulse to the Delay State Counter 518. If the Averaging Counter 514 sum is greater that 0, then the delay chain on average is too slow, and the State Update Logic sends a decrement pulse to the Delay State Counter 518, which will result in a faster delay chain. On the other hand, if the Averaging Counter 514 sum is less than zero, meaning the delay chain is too fast, then the update pulse will be an increment pulse to configure the chain in a slower configuration. If the sum is zero, no change is made because the delay chain on average has the correct delay. The update pulse from the State Update Logic block 520 propagates through the Delay State Counter 518 and Configuration LUT 522 and results in a new delay chain configuration. After reaching the "latency" setting, the Lag/Latency Counter 516 resets to zero and starts a new update cycle.

The Delay State Counter 518 increments or decrements a delay state count based on the result in the Averaging Counter 514 at the end of the latency period. It counts up to a high limit corresponding to the longest delay configuration of the delay chain 502, or a low limit of 0, which corresponds to the shortest delay configuration of the delay chain 502. The Delay State Counter 518 asserts a limit reached signal if either of these limits is reached and an increment or decrement pulse arrives to send the counter beyond the limit.

The counting pattern of the Delay State Counter 518 matches the Configuration Look-up Table (LUT) values (see TABLE 1 below), with the goal of hunting around the end-of-chain selection and freezing all other chain selections. Hunting around delay chain configurations that change an intermediate delay element rather than the end of chain element can cause glitches to propagate down the chain as a delay element reconfigures. These glitches would cause unacceptable jitter in the output waveforms of the digital delay locked loop, and consequently in the larger digital phase locked loop system.

To hunt only around the end of chain setting, according to the preferred embodiment of the present invention, the Delay State Counter 518 increments up one step from even to odd, and down one step from odd to even. This is the steady-state hunting condition. Incrementing up from an odd value or down from an even value means that another chain element must be changed besides the end of chain element, and the delay state counter 518 changes by two steps. The two-step change in either direction is a chain re-configuration and is not intended to be a steady-state condition.

The Configuration LUT 522 decodes the configuration step from the delay state counter 518 to a setting for each delay chain element. An example Configuration LUT is shown in the table below (see TABLE 1 below) for a 4 element delay chain where each delay element has 4 delay settings. The Configuration LUT 522 maps the Delay State Counter 518 output value to a specific configuration setting for each delay element setting. When a chain configuration update occurs, the Configuration LUT 522 looks up the new chain configuration using the Delay State Counter 518 output value as an index.

The intent of the lookup table selections (see for example TABLE 1 below) is to get the delay chain 502 in a configuration that hunts around the end-of-chain setting (delay element 3.) While hunting, the configuration counter will increment one step from even to odd, and decrement one step from odd to even. However, incrementing from odd will be a two step increment to the next odd value. Similarly, decrementing from an even count value steps down to the next even value. In this way, the system jumps by two's until it reaches the next hunting level, after which it will hunt between two adjacent steps.

TABLE 1

| Config Step | Delay Element Settings 0 | 1 | 2 | 3 | Next step Up | Down |
|---|---|---|---|---|---|---|
| 0 | 0 | 0 | 0 | 0 | 1 | 0 |
| 1 | 0 | 0 | 0 | 1 | 3 | 0 |
| 2 | 0 | 1 | 0 | 0 | 3 | 0 |
| 3 | 0 | 1 | 0 | 1 | 5 | 2 |
| 4 | 1 | 0 | 1 | 0 | 5 | 2 |
| 5 | 1 | 0 | 1 | 1 | 7 | 4 |
| 6 | 1 | 1 | 1 | 0 | 7 | 4 |
| 7 | 1 | 1 | 1 | 1 | 9 | 6 |
| 8 | 1 | 1 | 1 | 1 | 9 | 6 |
| 9 | 1 | 1 | 1 | 2 | 11 | 8 |
| 10 | 1 | 2 | 1 | 1 | 11 | 8 |
| 11 | 1 | 2 | 1 | 2 | 13 | 10 |
| 12 | 2 | 1 | 2 | 1 | 13 | 10 |
| 13 | 2 | 1 | 2 | 2 | 15 | 12 |
| 14 | 2 | 2 | 2 | 1 | 15 | 12 |

TABLE 1-continued

| Config Step | Delay Element Settings 0 | 1 | 2 | 3 | Next step Up | Down |
|---|---|---|---|---|---|---|
| 15 | 2 | 2 | 2 | 2 | 17 | 14 |
| 16 | 2 | 2 | 2 | 2 | 17 | 14 |
| 17 | 2 | 2 | 2 | 3 | 19 | 16 |
| 18 | 2 | 3 | 2 | 2 | 19 | 16 |
| 19 | 2 | 3 | 2 | 3 | 21 | 18 |
| 20 | 3 | 2 | 3 | 2 | 21 | 18 |
| 21 | 3 | 2 | 3 | 3 | 23 | 20 |
| 22 | 3 | 3 | 3 | 2 | 23 | 20 |
| 23 | 3 | 3 | 3 | 3 | 23 | 22 |

Figure 6:
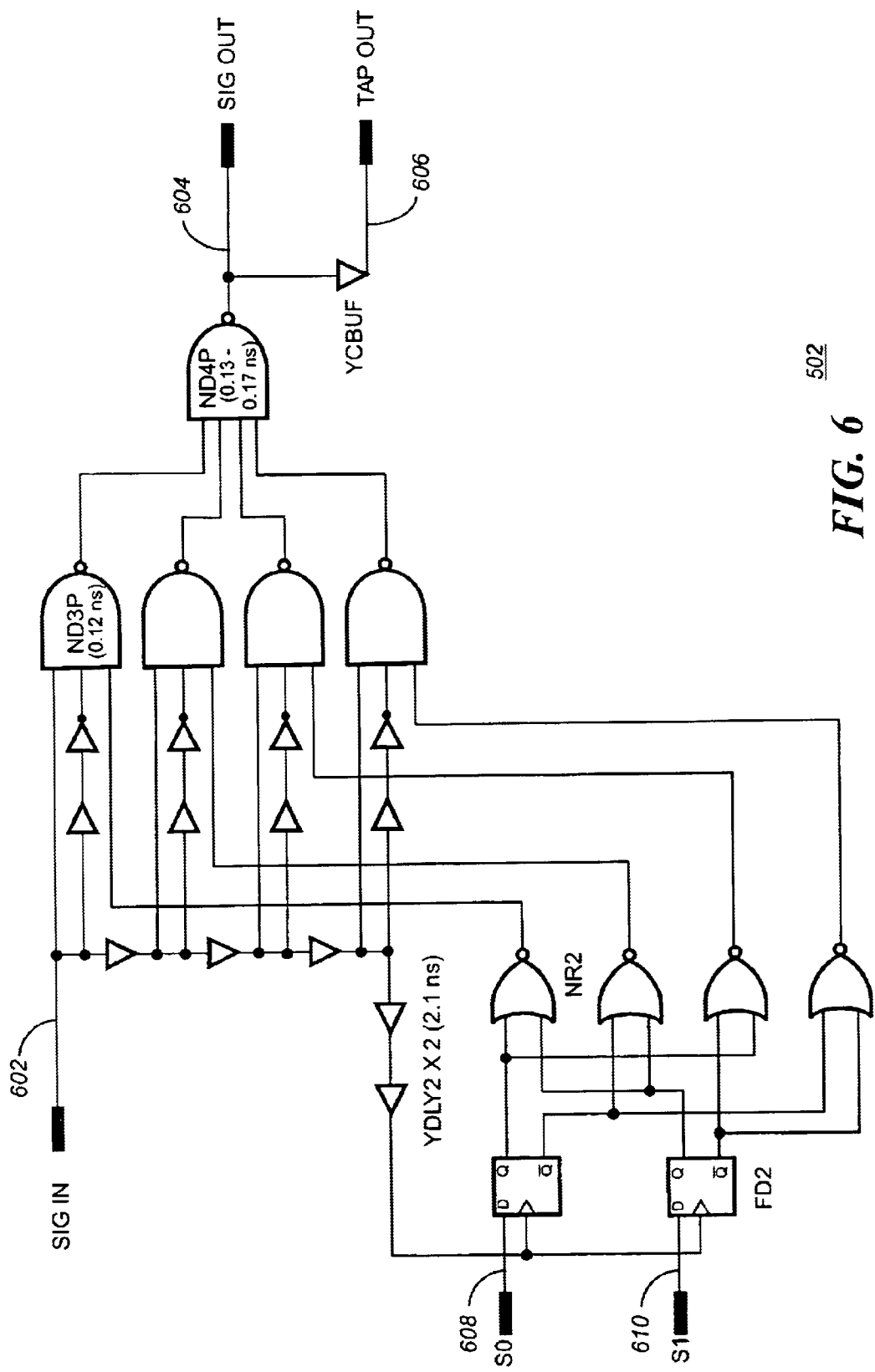
FIG. 6 is a more detailed circuit block diagram of a digitally programmable delay element in the programmable delay chain shown in FIG. 2, in accordance with a preferred embodiment of the present invention.

Referring to FIG. 6, a programmable delay element 502 is illustrated in accordance with a preferred embodiment of the present invention. The minimum gate delay is typically on the order of 0.1 ns. To achieve programmability, an additional gate is insert so the absolute minimum delay of a generic programmable delay element is 2 gates or roughly 0.2 ns. The time estimates provided above are only for presenting an example and not as a limitation of any particular implementation. As shown in FIG. 6, the overall signal delay in the programmable delay element 502 consists of the delay across a 3 input NAND, a 4 input NAND, and a buffer, which together, in this example, result in a delay element range of 0.25 ns to 0.62 ns in 0.12 ns increments.

In addition to the signal to be delayed, the other inputs to the 3 input NAND are a delay inverter combination and a select signal. The delay inverter combination chops the pulse down to 1.15 ns regardless of the input width. This is necessary because of the non-symmetric rise and fall times through the NANDs which result in the duty cycle of the signal going through the delay chain increasing to 100%, eliminating the clock edge towards the end of the chain. The minimum width of this pulse is determined by the toggle flip-flop clock pulse timing requirements.

The select signal going to the 3 input NAND comes from a one-hot decoding network, which decodes the two bit input select signal 608, 610. The select signal is latched by a version of the input signal delayed long enough to ensure that the output pulse is gone and the output is low during the select transition. This allows delay selection to occur in a different clock domain while ensuring glitch free output pulses during a selection change.

The two outputs of the programmable delay element have the same logical signal however one is intended to be connected only to the input of the next delay element while the other is buffer driven and can have a much larger fan out. This output configuration avoids another gate delay in the delay chain and limits the fan out of the 4 input NAND to keep the minimum delay as low as possible.

A chain of programmable delay elements has one additional element electrically connected to the last tapped delay element to keep symmetrical loading and delays on all tapped delay elements as much as possible without custom layout. For example, a delay chain with 8 tapped, programmable delay elements will have a total of 9 identical programmable delay elements, with the last element being used only for loading symmetry.

Figure 7:
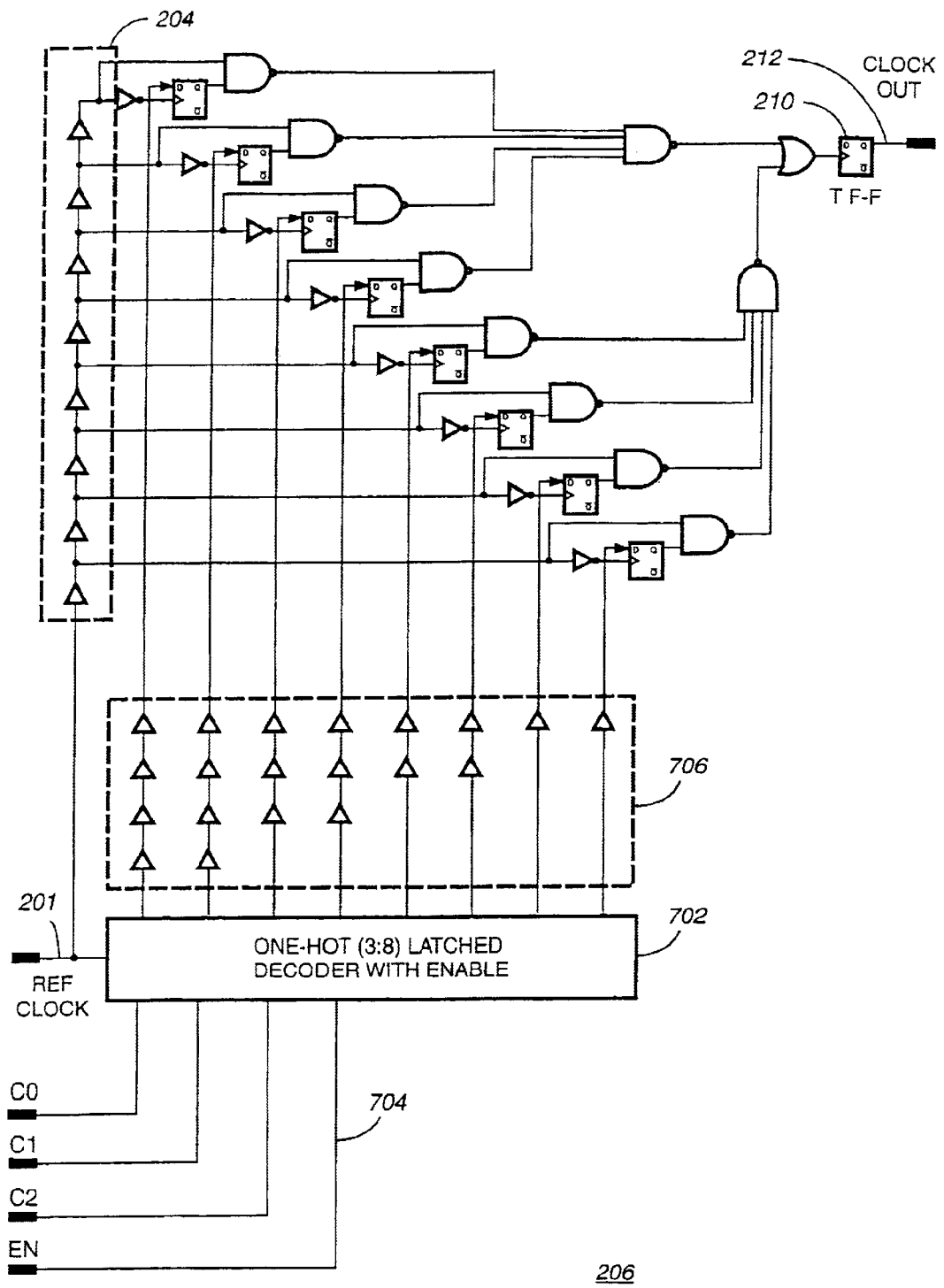
FIG. 7 is a more detailed circuit block diagram of a Non-glitching MUX shown in FIG. 2, according to a preferred embodiment of the present invention.

Referring to FIG. 7, the Non-glitching MUX 206 is shown according to a preferred embodiment of the present invention. A one-hot decoder with enable 702 decodes the edge selection coming from the phase counter 208. This select signal is latched at the falling edge of the tap delay signal by a latch at each tap point. This latching mechanism ensures any tap output enable transition occurs only when the output signal is zero. The output pulses from one or more delay chains are gathered up (OR'd) by a network of NANDs and a final OR. The result is a pulse train with rising edges spaced at ½ the period of the output clock, within the time resolution of the delay chain. All tap select lines can be disabled by a de-asserted enable signal 704 to the decoder 702. This adds a full reference clock period delay between output edges. Fixing the enable signal at one tap point will result in an output frequency of exactly ½ the reference clock 201. This is the maximum output frequency of the system. All other (lower) frequencies require the tap point to progress "forward" in time, occasionally skipping a reference clock edge altogether.

Figure 8:
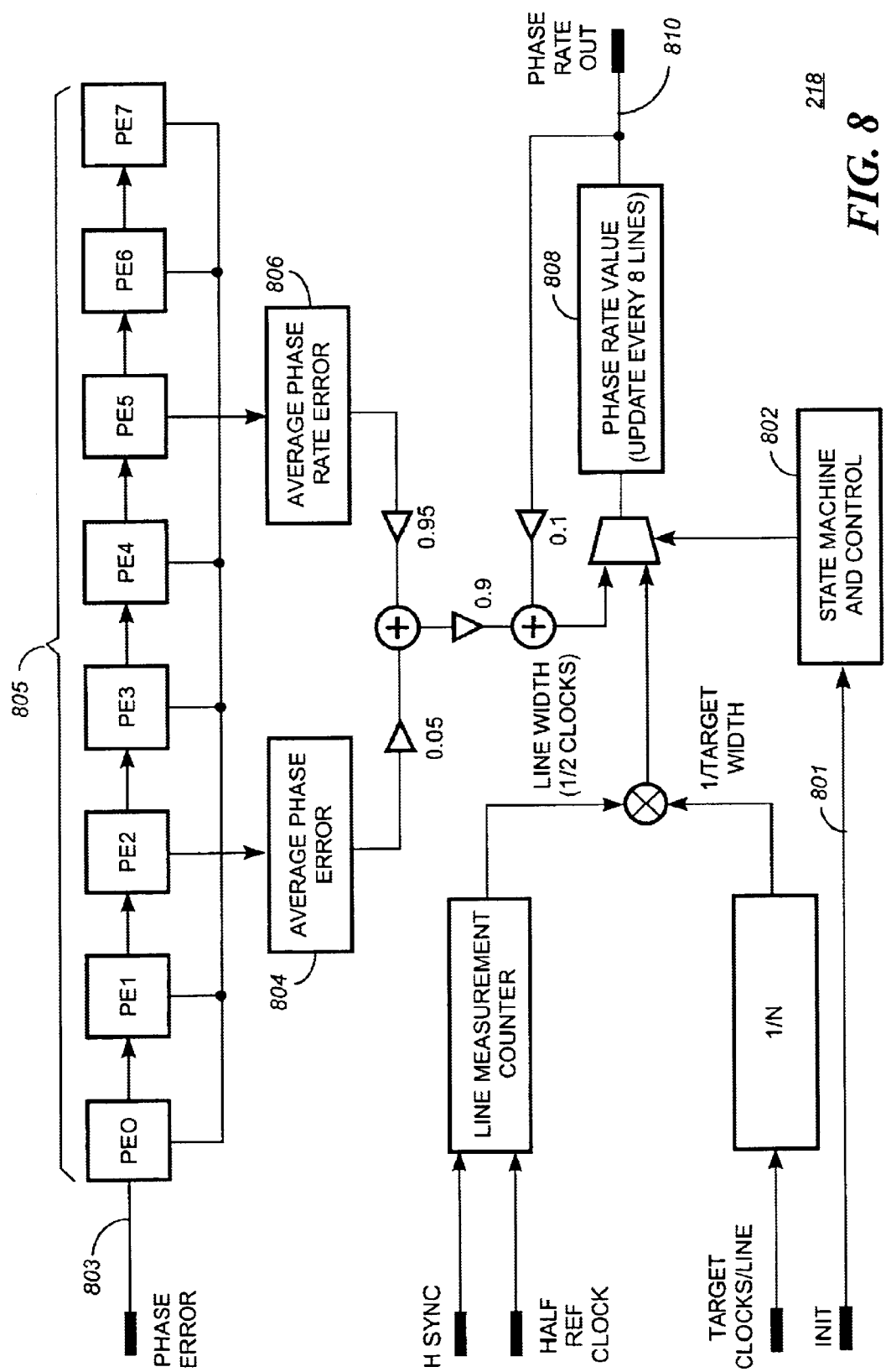
FIG. 8 is a more detailed circuit block diagram of a system controller and loop filter illustrated in FIG. 2, in accordance with a preferred embodiment of the present invention.

Referring to FIG. 8, a system control and loop filter 218 is illustrated according to a preferred embodiment of the present invention. The system control and loop filter outputs a phase rate formation and provides it via the control bus 222 to the phase accumulator 208. The initial phase rate is computed directly by counting the number of ½ reference clocks that occur between input horizontal sync signals. Scaling this measurement by 1 divided by N, when N is the target number of clocks per line, gives the initial phase rate value, which should generate a synthesized H sync that is within one ½ reference clock of the actual H sync. Also, to get the first synthesized H sync to match the input H sync in phase, the H sync synthesis machinery is triggered as close as possible to the next H sync following the initial phase rate computation. This first phase rate value can be improved by improving the precision of the initial measurement by counting ½ reference clocks over several lines and averaging.

Because the initial phase rate and phase will have a small but non-zero phase error, and because the input signals and the system can change properties over time, a loop filter control system is used to drive the phase error to 0. As shown in FIG. 8, the phase error and phase error rate from the H sync phase detector are averaged over 8 line times to reduce the H sync input jitter noise and the discretization noise of the phase detector 224, particularly in the rate measurement. The average phase error 804 and the average phase rate error 806 are weighted and combined to generate an overall correction signal, which is applied to a single tap second order filter. The filtered output is updated every 8 lines and is sent to the clock phase counter or phase accumulator 208.

The present invention offers significant advantages over the prior art. For example, by incorporating an all digital PLL and a high precision all digital phase detector devices utilizing the present invention can generate frequencies with very high precision, and with insensitivity to variation in temperature, noise, and manufacturing process. This results in significantly improved performance for devices incorporating the present invention and at a much lower cost than conventionally available analog circuit solutions.

Although specific embodiments of the invention have been disclosed, it will be understood by those having ordinary skill in the art that changes can be made to the specific embodiments without departing from the spirit and scope of the invention. Additionally, many modifications may be made to adapt a particular situation to the teachings of the present invention without departing from the central inventive concepts described herein. Furthermore, an embodiment of the present invention may not include all of the features described above. The scope of the invention is not to be restricted, therefore, to the specific embodiments, and it is intended that the appended claims cover any and all such applications, modifications, and embodiments within the scope of the present invention.

What is claimed is:

1. A digital phase lock loop comprising:

an electrical input for receiving an input reference signal;

an electrical output for providing an output signal that is a digitally generated synthesized version of the input reference signal;

a control circuit;

a digital phase detector, electrically coupled to the electrical input, the electrical output, and the control circuit, to compare an edge of the input reference signal to an edge of the output signal to provide a digital code information representing a phase error between the edge of the input reference signal and the edge of the output signal, and wherein the digital phase detector comprises a first delay chain arranged to be driven by the input reference signal and a second delay chain arranged to be driven by the output signal and in opposing timing orientation to the first delay chain, the arrangement of delay elements in the first and second delay chains, respectively, for providing a comparison of the edge of the input reference signal relative to the edge of the output signal; and a digital frequency synthesizer, being electrically coupled to the control circuit and the digital phase detector, the digital frequency synthesizer comprising:

a reference clock input for receiving a reference clock signal;

a digital DLL, electrically coupled to the control circuit and the reference clock input, the digital DLL including a plurality of delay chains, each of the delay chains including at least one digitally programmable delay element for the control circuit dynamically configuring the plurality of delay chains for the output signal to achieve a phase lock with the input reference signal;

a phase accumulator, electrically coupled to the digital DLL, the digital phase detector, and the control circuit, for precisely dividing a timing period of the input reference signal; and a non-glitching MUX electrically coupled to the digital DLL, the phase accumulator, and the electrical output, for selecting a tap output from one of the at least one digitally programmable delay element to select glitch-free a first signal comprising at least one pulse from the selected output tap.

2. The digital phase lock loop of claim 1, wherein the selected first signal comprising at least one pulse corresponds to the output signal.

3. The digital phase lock loop of claim 1, further comprising:

a digital controller electrically coupled to the digital phase detector and the digital frequency synthesizer; and a memory electrically coupled to the digital controller, and including instructions for the digital controller to control the digital frequency synthesizer to generate the first signal; and use the digital code to control the digital frequency synthesizer to adjust the phase of the output signal to match a phase of the input reference signal.

4. The digital phase lock loop of claim 3, wherein the memory further includes instructions for the digital controller to perform a digital loop filter function on the digital code information.

5. The digital phase lock loop of claim 4, wherein the digital loop filter function comprises a low pass filter function.

6. The digital phase lock loop of claim 1, wherein the digital DLL, the non-glitching MUX, the phase accumulator, and digital phase detector, are all constructed using an all digital circuit implementation.

7. The digital phase lock loop of claim 6, wherein the all digital circuit implementation comprises standard cell construction for an integrated circuit.

8. The digital phase lock loop of claim 1, wherein the digital DLL, the non-glitching MUX, the phase accumulator, and the digital phase detector, are incorporated into an integrated circuit.

9. The digital phase lock loop of claim 1, wherein the input reference signal is a reference horizontal sync signal and the output signal is a synthesized horizontal sync signal for driving a display monitor.

10. A system comprising:
a system controller;
a first input for receiving an input reference signal with a first edge; and
a digital phase lock loop, electrically coupled to the system controller and to the first input, comprising:
an electrical input, electrically coupled to the first input, for receiving the input reference signal;
an electrical output for providing an output signal that is a digitally generated synthesized version of the input reference signal;
a control circuit;
a digital phase detector, electrically coupled to the electrical input, the electrical output, and the control circuit, to compare an edge of the input reference signal to an edge of the output signal to provide a digital code information representing a phase error between the edge of the input reference signal and the edge of the output signal, and wherein the digital phase detector comprises a first delay chain arranged to be driven by the input reference signal and a second delay chain arranged to be driven by the output signal and in opposing timing orientation to the first delay chain, the arrangement of delay elements in the first and second delay chains, respectively, for providing a comparison of the edge of the input reference signal relative to the edge of the output signal; and
a digital frequency synthesizer, being electrically coupled to the control circuit and the digital phase detector, the digital frequency synthesizer comprising:
a reference clock input for receiving a reference clock signal;
a digital DLL, electrically coupled to the control circuit and the reference clock input, the digital DLL including a plurality of delay chains, each of the delay chains including at least one digitally programmable delay element for the control circuit dynamically configuring the plurality of delay chains for the output signal to achieve a phase lock with an the input reference signal;
a phase accumulator, electrically coupled to the digital DLL, the digital phase detector, and the control circuit, for precisely dividing a timing period of the input reference signal; and
a non-glitching MUX electrically coupled to the digital DLL, the phase accumulator, and the electrical output, for selecting a tap output from one of the at least one digitally programmable delay element to select glitch-free a first signal comprising at least one pulse from the selected output tap.

11. The system of claim 10, wherein the selected first signal comprising at least one pulse corresponds to the output signal.

12. The system of claim 10, further comprising:
a digital controller electrically coupled to the digital phase detector and the digital frequency synthesizer; and
a memory electrically coupled to the digital controller, and including instruction for the digital controller to
control the digital frequency synthesizer to generate the first signal; and
use the digital code to control the digital frequency synthesizer to adjust the phase of the output signal to match a phase of the input reference signal.

13. The system of claim 12, wherein the memory further includes instructions for the digital controller to perform a digital loop filter function on the digital code information.

14. The system of claim 13, wherein the digital loop filter function comprises a low pass filter function.

15. The system of claim 10, wherein the digital DLL, the non-glitching MUX, the phase accumulator, and digital phase detector, are all constructed using an all digital circuit implementation.

16. The system of claim 15, wherein the all digital circuit implementation comprises standard cell construction for an integrated circuit.

17. The system of claim 10, wherein the digital DLL, the non-glitching MUX, the phase accumulator, and the digital phase detector, are incorporated into an integrated circuit.

18. The digital phase lock loop of claim 10, wherein the input reference signal is a reference horizontal sync signal and the output signal is a synthesized horizontal sync signal for driving a display monitor.

19. A flat panel monitor comprising:
a controller for controlling functions of the flat panel monitor;
a display for displaying information;
a video interface including a first input for receiving an input reference signal with a first edge; and
a digital phase lock loop, electrically coupled to the video interface, the controller, and the display, the digital phase lock loop comprising:
an electrical input, electrically coupled to the first input, for receiving the input reference signal;
an electrical output for providing an output signal that is a digitally generated synthesized version of the input reference signal;
a control circuit:
a digital phase detector, electrically coupled to the electrical input, the electrical output, and the control circuit, to compare an edge of the input reference signal to an edge of the output signal to provide a digital code information representing a phase error between the edge of the input reference signal and the edge of the output signal, and wherein the digital phase detector comprises a first delay chain arranged to be driven by the input reference signal and a second delay chain arranged to be driven by the output signal and in opposing timing orientation to the first delay chain, the arrangement of delay elements in the first and second delay chains, respectively, for providing a comparison of the edge of the input reference signal relative to the edge of the output signal; and
a digital frequency synthesizer, being electrically coupled to the control circuit and the digital phase detector, the digital frequency synthesizer comprising:

a reference clock input for receiving a reference clock signal;

a digital DLL, electrically coupled to the control circuit and the reference clock input, the digital DLL including a plurality of delay chains, each of the delay chains including at least one digitally programmable delay element for the control circuit dynamically configuring the plurality of delay chains for the output signal to achieve a phase lock with the input reference signal;

a phase accumulator, electrically coupled to the digital DLL, the digital phase detector, and the control circuit, for precisely dividing a timing period of the input reference signal; and a non-glitching MUX electrically coupled to the digital DLL, the phase accumulator, and the electrical output, for selecting a tap output from one of the at least one digitally programmable delay element to select glitch-free a first signal comprising at least one pulse from the selected output tap.

20. The flat panel monitor of claim 19, wherein the selected first signal comprising at least one pulse corresponds to the output signal.

21. The flat panel monitor of claim 19, further comprising:

a digital controller electrically coupled to the digital phase detector and the digital frequency synthesizer; and a memory electrically coupled to the digital controller, and including instructions for the digital controller to control the digital frequency synthesizer to generate the first signal; and use the digital code to control the digital frequency synthesizer to adjust the phase of the output signal to match a phase of the input reference signal.

22. The flat panel monitor of claim 21, wherein the memory further includes instructions for the digital controller to perform a digital loop filter function on the digital code information.

23. The flat panel monitor of claim 22, wherein the digital loop filter function comprises a low pass filter function.

24. The flat panel monitor of claim 19, wherein the digital DLL, the non-glitching MUX, the phase accumulator, and digital phase detector, are all constructed using an all digital circuit implementation.

25. The flat panel monitor of claim 24, wherein the all digital circuit implementation comprises standard cell construction for an integrated circuit.

26. The flat panel monitor of claim 19, wherein the digital DLL, the non-glitching MUX, the phase accumulator, and the digital phase detector, are incorporated into an integrated circuit.

27. The flat panel monitor of claim 19, wherein the input reference signal is a reference horizontal sync signal and the output signal is a synthesized horizontal sync signal for driving the display.

* * * * *